(12) United States Patent
Sugiyama et al.

(10) Patent No.: US 9,276,381 B2
(45) Date of Patent: Mar. 1, 2016

(54) QUANTUM CASCADE LASER

(71) Applicant: HAMAMATSU PHOTONICS K.K., Hamamatsu-shi, Shizuoka (JP)

(72) Inventors: Atsushi Sugiyama, Hamamatsu (JP); Tadataka Edamura, Hamamatsu (JP); Naota Akikusa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/520,500

(22) Filed: Oct. 22, 2014

(65) Prior Publication Data

US 2015/0117484 A1    Apr. 30, 2015

(30) Foreign Application Priority Data

Oct. 28, 2013 (JP) ................................ 2013-223262

(51) Int. Cl.
  *H01S 5/34* (2006.01)
  *H01S 5/028* (2006.01)
  *H01S 5/02* (2006.01)
  *H01S 5/22* (2006.01)

(52) U.S. Cl.
  CPC ............ *H01S 5/3401* (2013.01); *H01S 5/028* (2013.01); *H01S 5/0281* (2013.01); *H01S 5/0285* (2013.01); *H01S 5/0286* (2013.01); *H01S 5/0287* (2013.01); *H01S 5/34* (2013.01); *H01S 5/0207* (2013.01); *H01S 5/22* (2013.01)

(58) Field of Classification Search
  CPC ...... H01S 5/028; H01S 5/0281; H01S 5/0285; H01S 5/0286; H01S 5/0287; H01S 5/22; H01S 5/3401
  See application file for complete search history.

(56) References Cited

U.S. PATENT DOCUMENTS 5,472,787 A * 12/1995 Johnson et al. ............... 428/448
2006/0153262 A1 * 7/2006 Barbieri et al. ............ 372/43.01

FOREIGN PATENT DOCUMENTS

| JP | 01-152788 A | 6/1989 |
| JP | 2005-314802 A | 11/2005 |
| JP | 2011-243781 A | 12/2011 |

* cited by examiner

*Primary Examiner* — Armando Rodriguez
(74) *Attorney, Agent, or Firm* — Drinker Biddle & Reath LLP

(57) ABSTRACT

A quantum cascade laser includes a semiconductor substrate, and an active layer being provided on the substrate, and having a cascade structure in which quantum well emission layers and injection layers are alternately laminated, and the laser has a base portion including the substrate, and a stripe-shaped ridge portion including the active layer. Further, a reflection control film is formed from a ridge end face over a base end face on an end face in a resonating direction of the laser, and, on the base end face, for a second side and a third side adjacent to a first side on the ridge portion side of the base end face, and a fourth side facing the first side, the reflection control film is formed on a region other than regions near those three sides with predetermined widths.

5 Claims, 11 Drawing Sheets

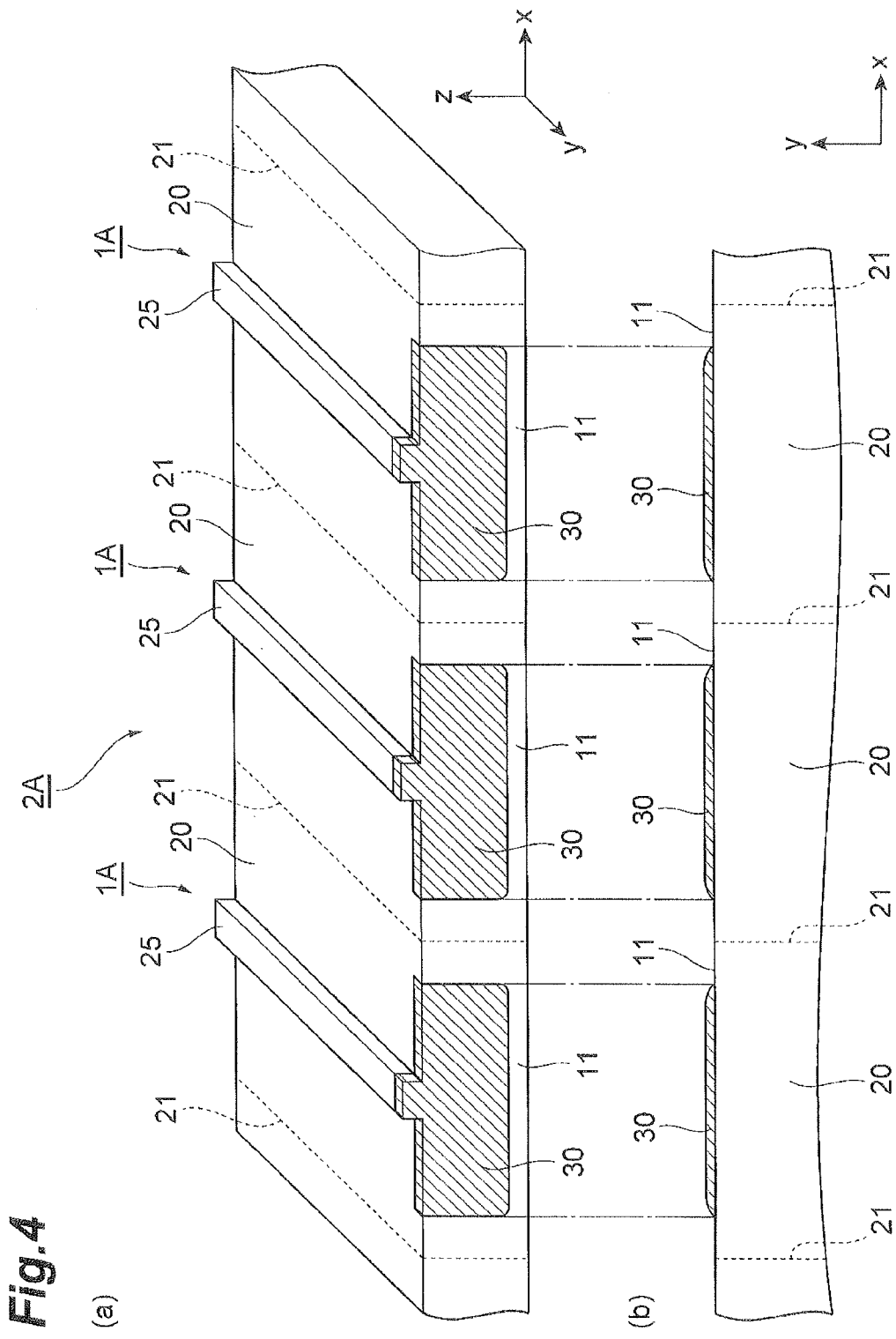

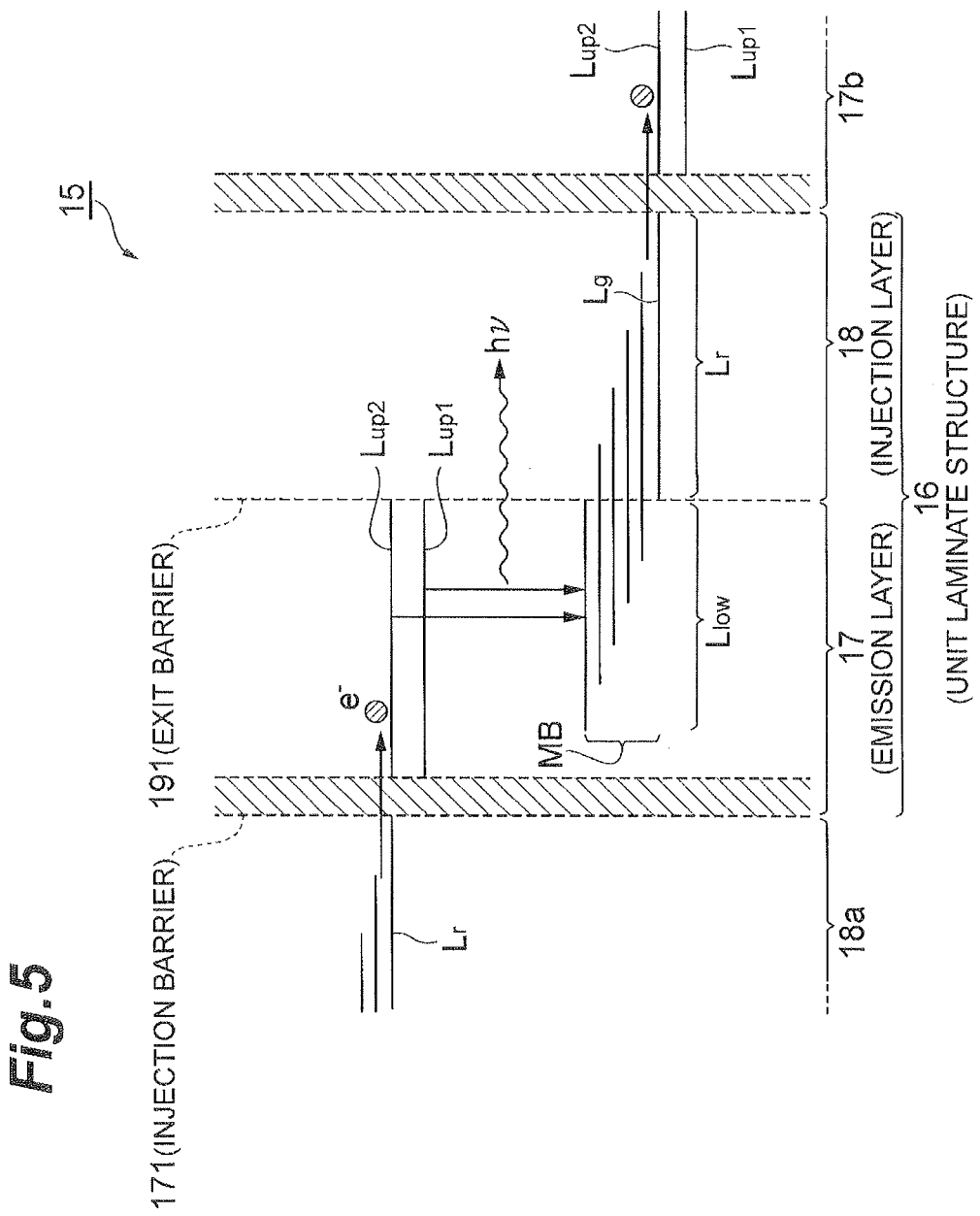

Fig.6

| SEMICONDUCTOR LAYER | | COMPOSITION | LAYER THICKNESS | DOPING |
|---|---|---|---|---|
| INJECTION BARRIER LAYER 171 | | InAlAs | 3.8nm | undoped |
| EMISSION LAYER 17 | WELL LAYER 161 | InGaAs | 3.8nm | undoped |
| | BARRIER LAYER 172 | InAlAs | 2.3nm | undoped |
| | 162 | InGaAs | 8.5nm | undoped |
| | 173 | InAlAs | 1.0nm | undoped |
| | 163 | InGaAs | 6.9nm | undoped |
| | 174 | InAlAs | 1.1nm | undoped |
| | 164 | InGaAs | 5.6nm | undoped |
| EXIT BARRIER LAYER 191 | | InAlAs | 1.2nm | undoped |
| INJECTION LAYER 18 | WELL LAYER 181 | InGaAs | 4.8nm | undoped |
| | BARRIER LAYER 192 | InAlAs | 1.3nm | undoped |
| | 182 | InGaAs | 4.5nm | undoped |
| | 193 | InAlAs | 1.4nm | undoped |
| | 183 | InGaAs | 4.2nm | undoped |
| | 194 | InAlAs | 1.6nm | Si doped: $8 \times 10^{16}/cm^3$ |
| | 184 | InGaAs | 4.1nm | Si doped: $8 \times 10^{16}/cm^3$ |
| | 195 | InAlAs | 1.8nm | Si doped: $8 \times 10^{16}/cm^3$ |
| | 185 | InGaAs | 4.0nm | Si doped: $8 \times 10^{16}/cm^3$ |
| | 196 | InAlAs | 2.3nm | undoped |
| | 186 | InGaAs | 4.0nm | undoped |
| | 197 | InAlAs | 2.6nm | undoped |
| | 187 | InGaAs | 4.0nm | undoped |

Fig.9
(a)
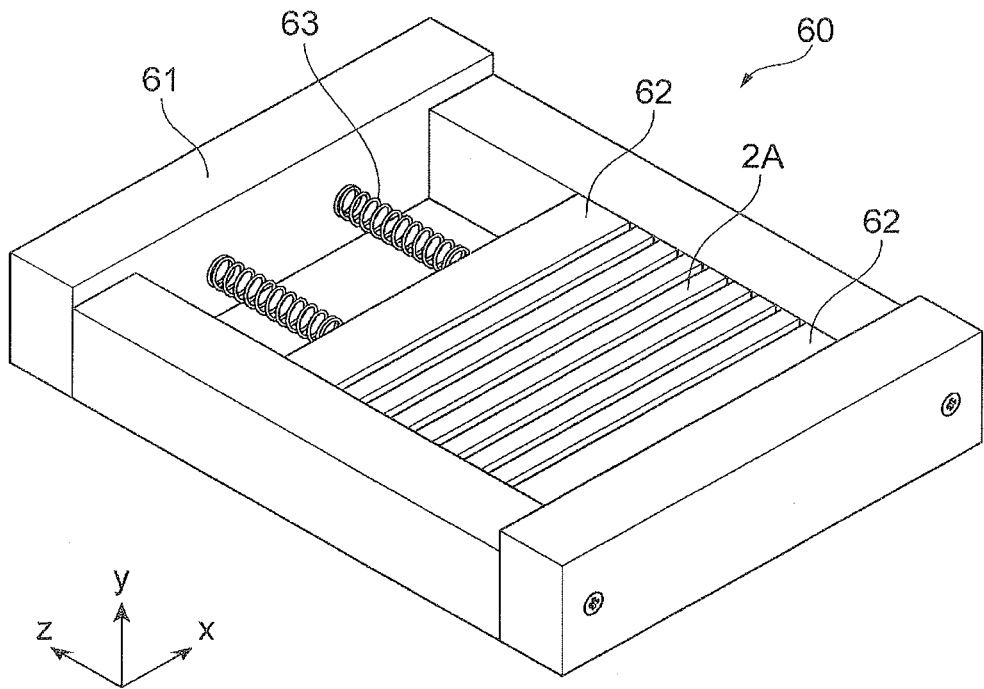
(b)
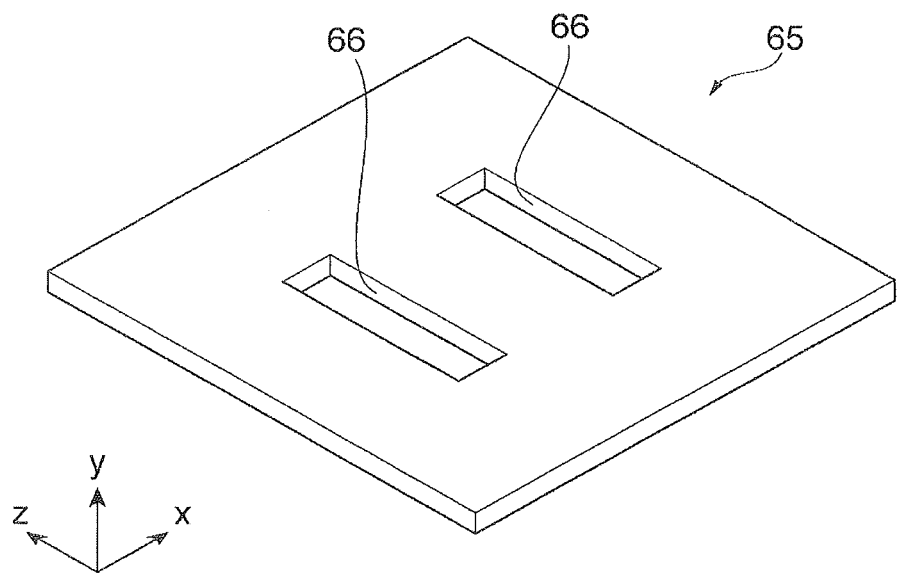

Fig.10
(a)
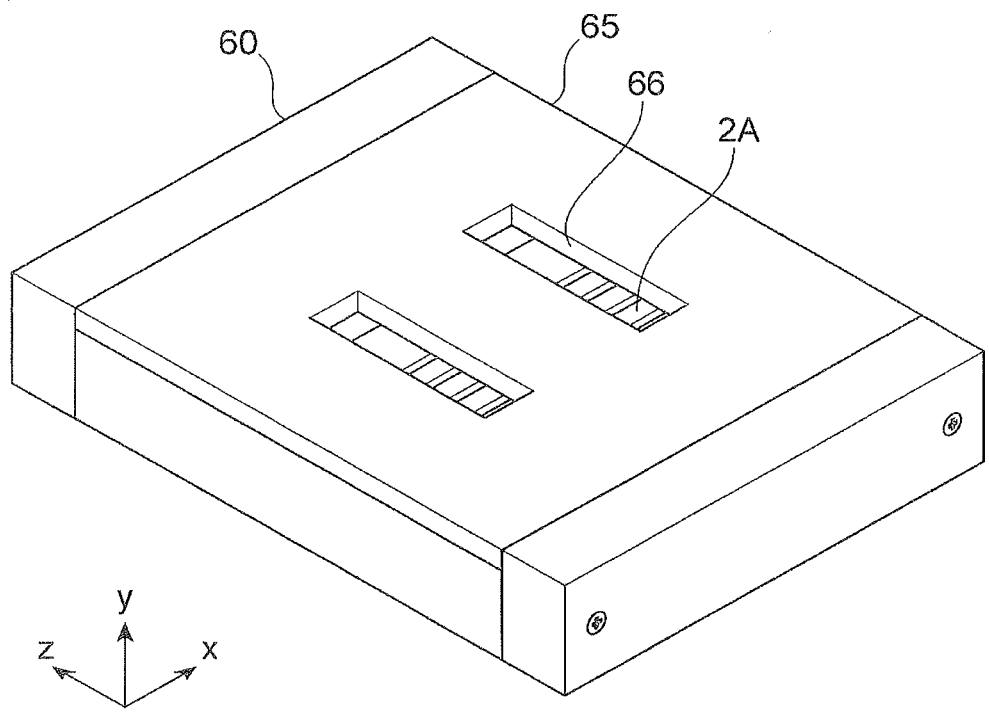
(b)
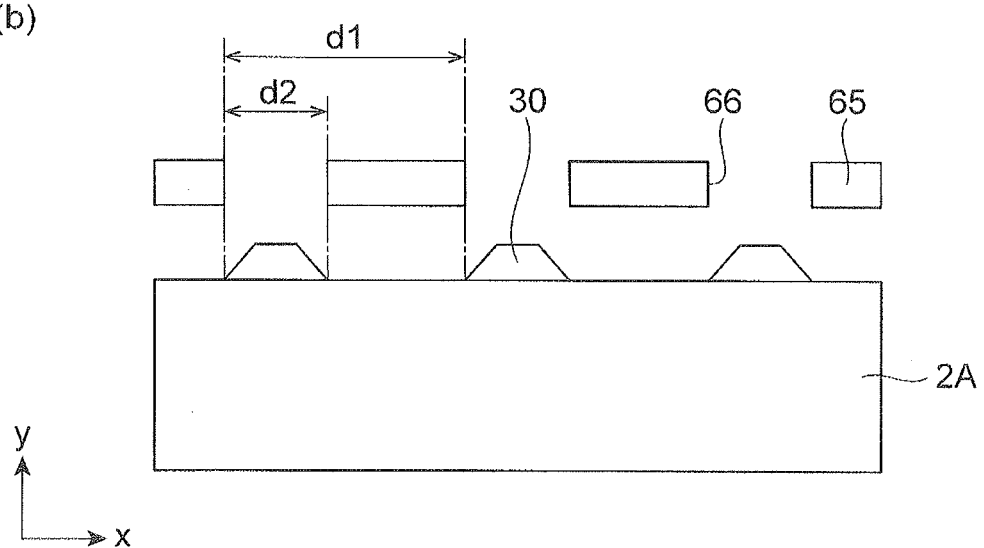

Fig.11
(a)
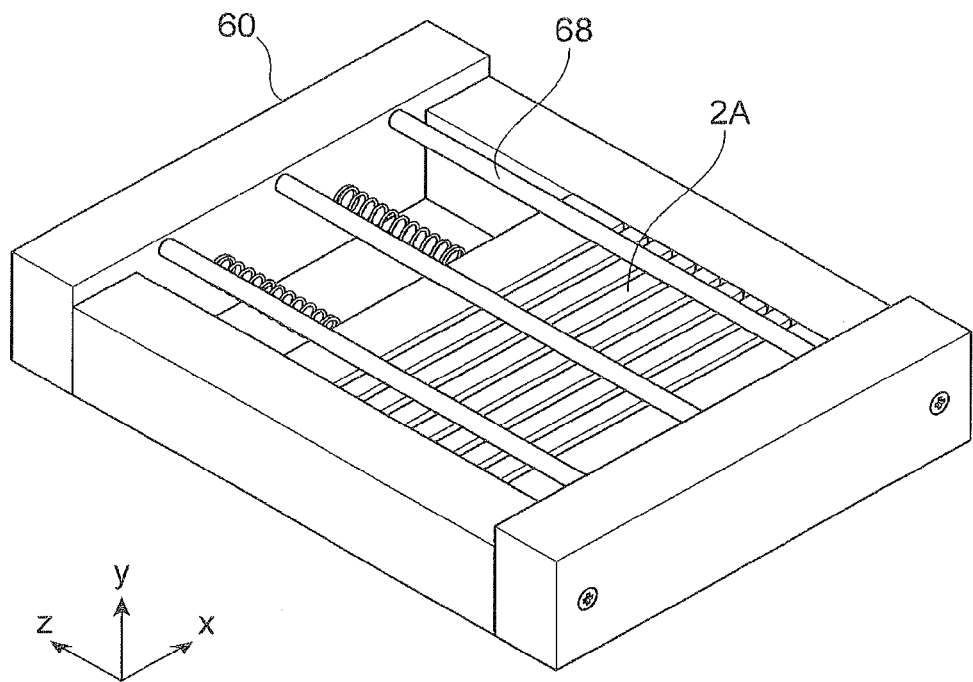
(b)
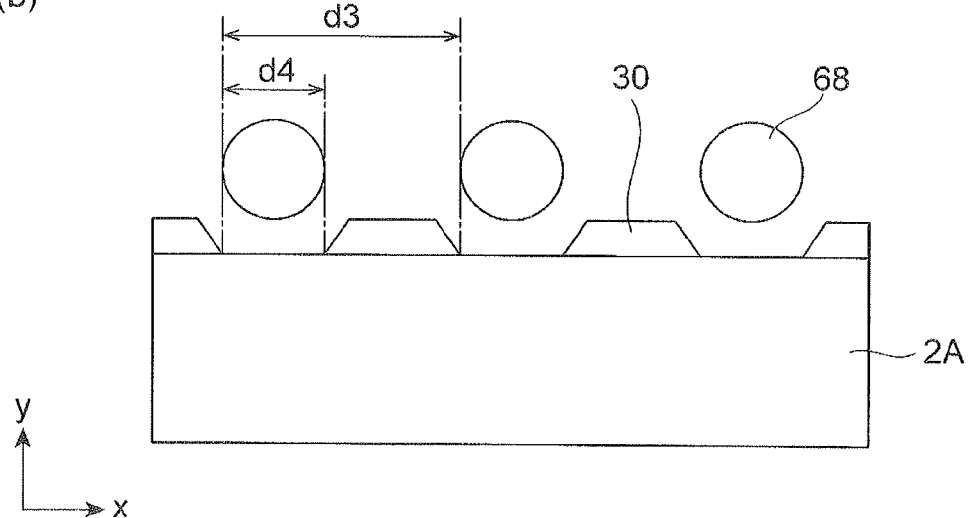

QUANTUM CASCADE LASER

BACKGROUND OF THE INVENTION

1. Field of the Invention

The present invention relates to a quantum cascade laser using intersubband transition in a quantum well structure.

2. Related Background Art

Light with a mid-infrared wavelength region (for example, wavelength of 3 to 30 μm) is an important wavelength region in the field of spectroscopy analysis. As a high-performance semiconductor light source in this wavelength region, in recent years, quantum cascade lasers (QCL) have gained attention (for example, refer to Patent Document 1).

A quantum cascade laser is a monopolar type laser device which uses a level structure including subbands formed in a semiconductor quantum well structure and generates light by means of intersubband electron transition, and can realize high efficiency and high-output operations by multistage cascade-coupling of quantum well emission layers which are formed by quantum well structures and become active regions. Further, this cascade coupling of quantum well emission layers is realized by using electron injection layers for injecting electrons into emission upper levels and alternately laminating quantum well emission layers and injection layers.

Patent Document 1: Japanese Patent Application Laid-Open No. 2011-243781
Patent Document 2: Japanese Patent Application Laid-Open No. H1-152788
Patent Document 3: Japanese Patent Application Laid-Open No. 2005-314802

SUMMARY OF THE INVENTION

In general, a stable single mode operation is required in application of a laser device for spectroscopic measurement, sensing, and the like. In the above-described quantum cascade laser, for example, in a case of controlling a laser oscillation mode with an external cavity (EC) type or a distributed feedback (DFB) type configuration, it is indispensable to form a reflection control film such as an anti-reflection (AR) film or a high-reflection (HR) film on device end faces located in a resonating direction of light, and control reflectance therewith (for formation of a reflection control film, for example, refer to Patent Documents 2 and 3).

For example, in a quantum cascade laser which outputs light with a wavelength of 7 μm or less, it is possible to realize an anti-reflection film (a non-reflection film) with a relatively thin film thickness by using $Al_2O_3$ as a material of a reflection control film. Meanwhile, in a long-wavelength region with a wavelength of 7 μm or more, because absorption of light is high, it is not possible to use $Al_2O_3$. Therefore, with respect to such light at the wavelength, a reflection control film is configured by a multilayer film in which low refraction index films using a material transparent in the wavelength region (a material having sufficient optical transparency) and high refraction index films are alternately laminated.

In the case where a reflection control film is configured by a multilayer film, for example, $CeO_2$ and ZnS may be used as a material of low refraction index films. Further, for example, Ge may be used as a material of high refraction index films. In a reflection control multilayer film composed of such materials, a total film thickness thereof becomes 1 μm or more, and the longer the wavelength of the laser is, the thicker its film thickness is.

Here, in a manufacturing process of a quantum cascade laser, coating of a reflection control film onto an end face in the resonating direction of the laser device is usually applied in a state of a laser bar in which a plurality of laser devices are arrayed in a direction perpendicular to a resonating direction of light. The laser bar coated with a reflection control film is thereafter split into respective laser devices (single device) by cleavage or the like, and a process such as soldering onto a sub-mount is carried out for each laser device.

In a case where the film thickness of the reflection control film is adequately thin, even when applying coating onto the entire surface of the laser bar end face, it is possible to easily divide it into a single device without causing damage such as peeling or cracks to the reflection control film. On the other hand, in a case of a thick reflection control film corresponding to a long wavelength region, at the time of cleaving it into a single device, the reflection control film is not segmented along with a semiconductor base material, that causes burrs, peeling, or the like. Further, at the time of mounting the laser device onto the sub-mount, cracks and the like are caused in the reflection control film by stress. Such transmutation and deterioration in a reflection control film in the manufacturing process of the laser device causes a lowering in production yield and reliability of the laser device.

The present invention has been made to solve the above-described problem, and an object thereof is to provide a quantum cascade laser capable of suppressing transmutation and deterioration in a reflection control film in the manufacturing process of a laser device.

In order to achieve the above object, a quantum cascade laser according to the present invention includes (1) a semiconductor substrate, and (2) an active layer being provided on the semiconductor substrate, and having a cascade structure in which quantum well emission layers and injection layers are alternately laminated by multistage-laminating unit laminate structures each consisting of the quantum well emission layer and the injection layer, the active layer generating light by intersubband transition in a quantum well structure, and the quantum cascade laser includes (3) a base portion including the semiconductor substrate, and a ridge portion including the active layer, being provided on the base portion, and extending to be a stripe shape in a resonating direction in a laser cavity structure for light with a predetermined wavelength generated in the active layer, and in the quantum cascade laser, (4) a reflection control film is formed from a ridge end face of the ridge portion including an end portion of the active layer over a base end face of the base portion at least on a first end face between the first end face and a second end face facing each other in the resonating direction, and (5) on the base end face, for a first side on the ridge portion side of the base end face, a second side and a third side adjacent to the first side, and a fourth side facing the first side, the reflection control film is formed on a region other than a region with a predetermined width from the second side, a region with a predetermined width from the third side, and a region with a predetermined width from the fourth side.

In the above-described quantum cascade laser, a laser device is configured with a ridge structure which has the base portion including the semiconductor substrate, and the ridge portion which includes the active layer having the cascade structure, and is formed into a stripe-shaped portion extending in the resonating direction with a width narrower than the base portion. Further, the reflection control film is formed for light with a predetermined wavelength generated in the active layer, on at least one surface (the first end face) of the two device end faces located in the resonating direction in the laser cavity structure so as to continue from the ridge end face including the end portion of the active layer over the base end face.

Moreover, in the above-described configuration, on the portion of the reflection control film which is formed on the base end face, for the second side and the third side (lateral sides) which are the two sides adjacent to the first side (upper side) on the ridge portion side of the base end face, and the fourth side (lower side) which is one side opposite to the first side, the reflection control film is not formed on a region with a predetermined width w2 from the second side, a region with a predetermined width w3 from the third side, and a region with a predetermined width w4 from the fourth side, and the reflection control film is formed on the region other than those regions.

In this way, in accordance with the configuration in which a reflection control film is not formed on regions near the three sides of the two lateral sides and the one lower side of the base end face, it is possible to suppress transmutation and deterioration in a reflection control film due to burrs, peeling, cracks, and the like being caused in the manufacturing process of a laser device. Accordingly, it is possible to realize a quantum cascade laser in which a laser oscillation mode is preferably controlled by the reflection control film without lowering production yield and reliability due to deterioration in a reflection control film.

In accordance with the quantum cascade laser of the present invention, a ridge structure which has the base portion including the semiconductor substrate, and the ridge portion including the active layer is made, the reflection control film is formed from the ridge end face including the end portion of the active layer over the base end face, on at least the first end face which is one of the two end faces located in the resonating direction for light with a predetermined wavelength generated in the active layer, and on the base end face, the reflection control film is formed on a region other than a region with a predetermined width from a second side, a region with a predetermined width from a third side, and a region with a predetermined width from a fourth side, with respect to the second side and the third side adjacent to a first side on the ridge portion side of the base end face, and the fourth side facing the first side, thereby it is possible to suppress transmutation and deterioration in the reflection control film in the manufacturing process of a laser device.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 4 includes (a) a perspective view and (h) a bottom view showing a configuration of a laser bar in which a plurality of laser devices are arrayed.

FIG. 5 is a diagram showing an example of a configuration of an active layer of the quantum cascade laser and a subband level structure in the active layer.

FIG. 6 is a chart showing an example of a structure of a unit laminate structure of one period in the active layer.

FIG. 9 includes perspective views showing an example of configurations of (a) a laser bar fixing jig and (b) a mask which are used in a process of forming the reflection control film.

FIG. 10 includes (a) a perspective view and (b) a plan sectional view showing an example of the process of forming the reflection control film using the laser bar fixing jig and the mask.

FIG. 11 includes (a) a perspective view and (b) a plan sectional view showing another example of the process of forming the reflection control film using the laser bar fixing jig and the mask.

DESCRIPTION OF THE EMBODIMENTS

Figure 1:
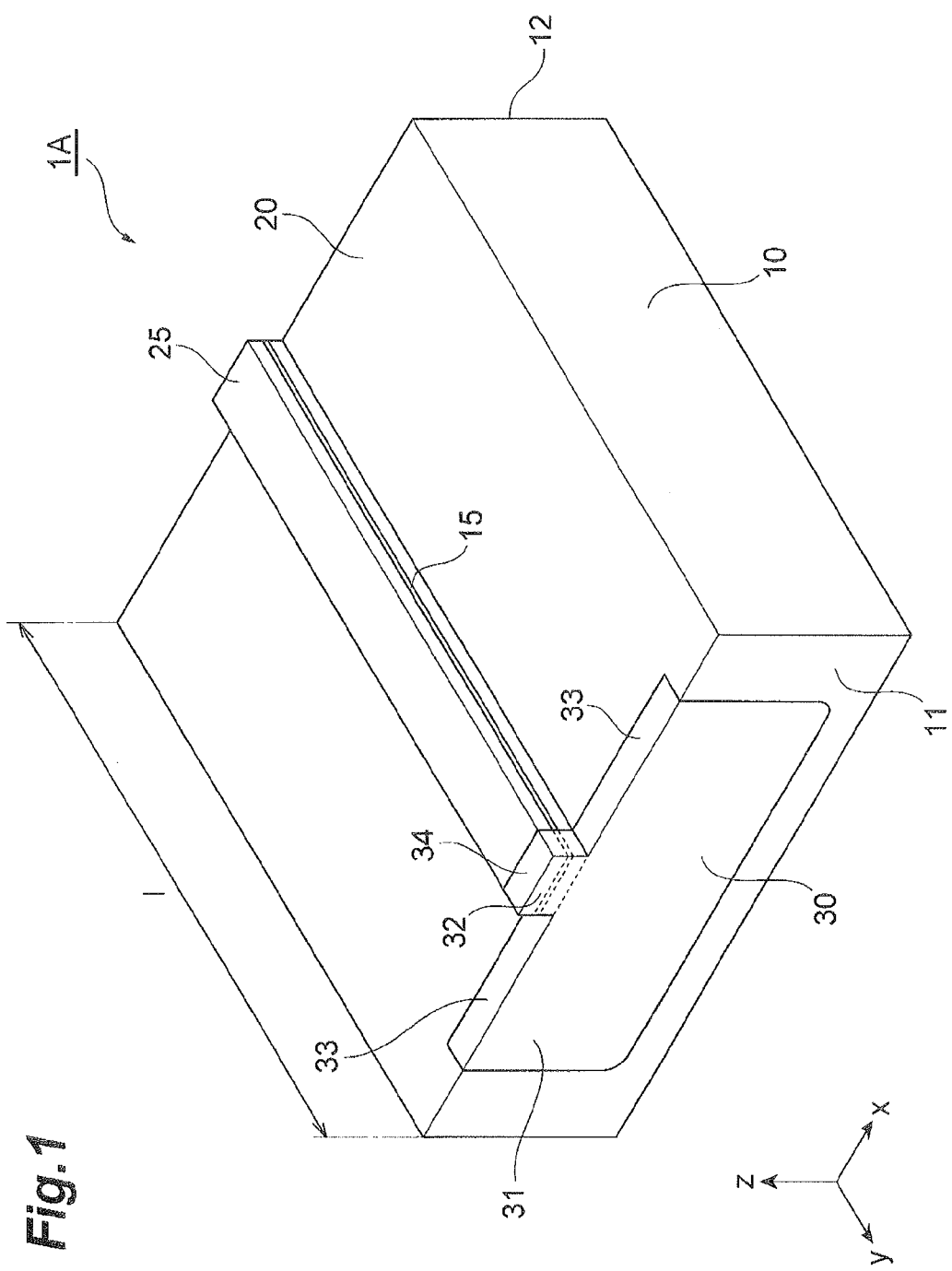
FIG. 1 is a perspective view showing a configuration of an embodiment of a quantum cascade laser.

Hereinafter, an embodiment of a quantum cascade laser according to the present invention will be described in detail with reference to the drawings. In the description of the drawings, the same components are attached with the same reference symbols, and overlapping description will be omitted. Moreover, the dimensional ratios in the drawings are not always equal to those in the description.

Figure 2:
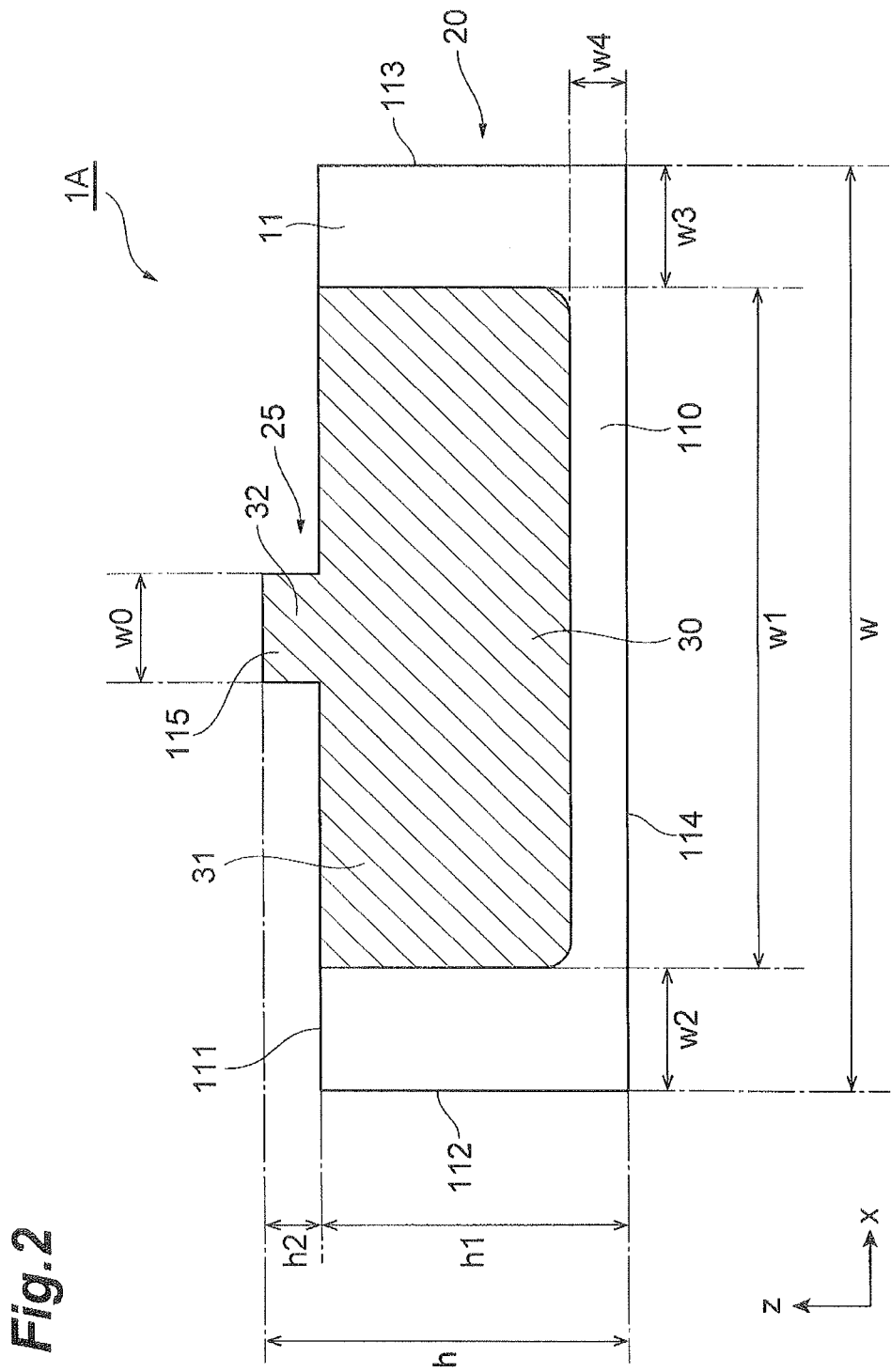
FIG. 2 is a front view showing the configuration of the quantum cascade laser shown in FIG. 1.
Figure 3:
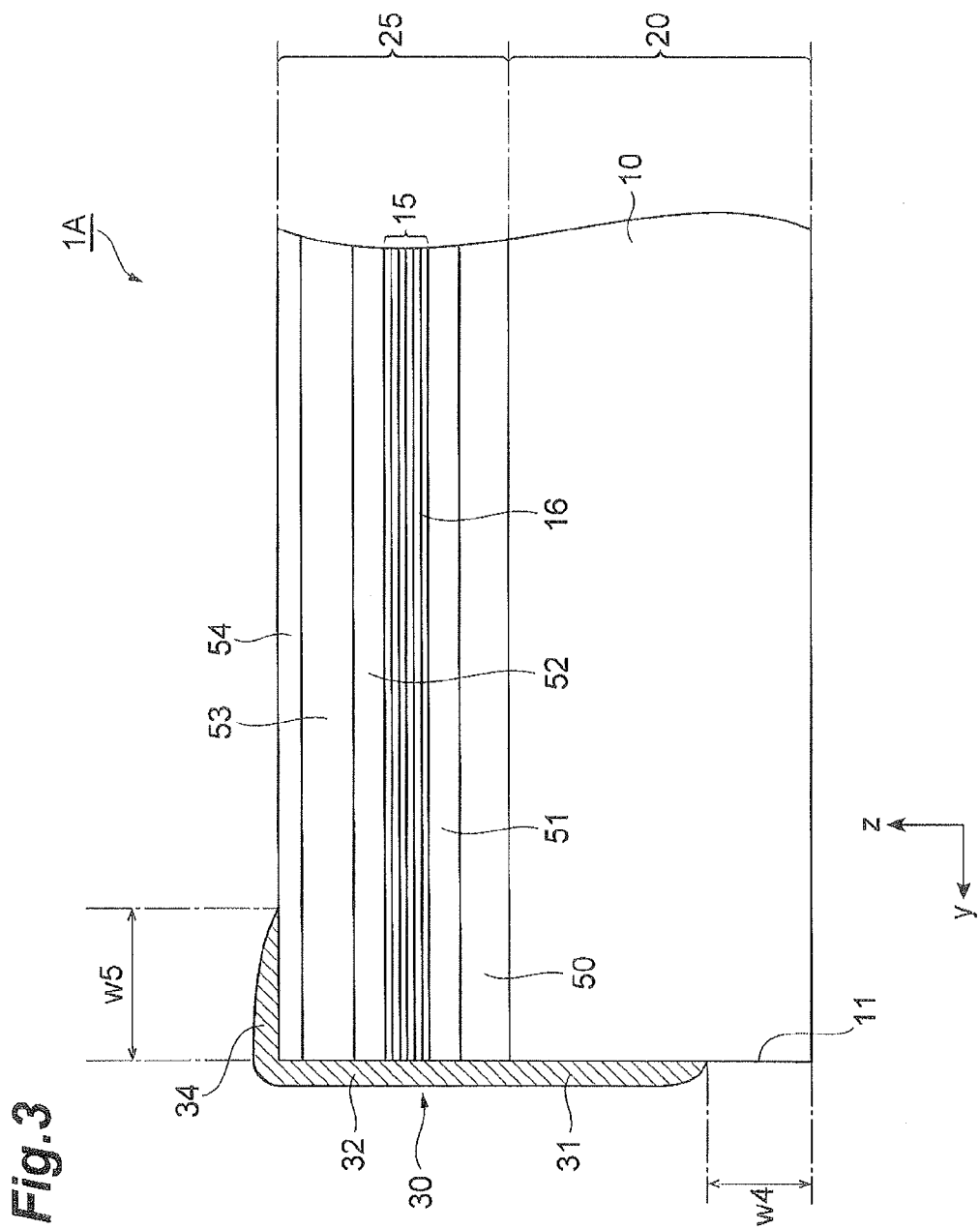
FIG. 3 is a side sectional view showing the configuration of the quantum cascade laser shown in FIG. 1.

FIG. 1 is a perspective view schematically showing a configuration of an embodiment of a quantum cascade laser according to the present invention. Further, FIG. 2 is a front view showing the configuration of the quantum cascade laser shown in FIG. 1. Further, FIG. 3 is a side sectional view showing the configuration of the quantum cascade laser shown in FIG. 1. Here, in FIG. 3, a side sectional view along the center line of a ridge portion in a ridge structure of a laser device is shown. Further, in the following respective diagrams, the xyz coordinate systems are shown for convenience of explanation. In this coordinate system, the x-axis direction is an array direction of laser devices in a laser bar which will be described later, the y-axis direction is a resonating direction in a laser cavity structure, and the z-axis direction is a lamination direction of respective semiconductor layers in a laser device main body.

A quantum cascade laser 1A of the present embodiment is a monopolar type laser device which generates light by using intersubband electron transition in a semiconductor quantum well structure. This quantum cascade laser 1A includes a semiconductor substrate 10 and an active layer 15 formed on the substrate 10. Further, in the quantum cascade laser 1A, electrodes for driving the laser 1A are respectively formed on the substrate 10 side and on a ridge portion 25 side. However, the electrodes are not shown in FIG. 1 to FIG. 3.

The active layer 15 has a cascade structure formed by alternately multistage-laminating quantum well emission layers to be used for generating light and electron injection layers to be used for injecting electrons into the emission layers. Specifically, a semiconductor lamination structure consisting of a quantum well emission layer and an injection layer is a unit laminate structure 16 of one period, and by multistage-laminating the unit laminate structures 16 (refer to FIG. 3), the active layer 15 having a cascade structure is formed. The number of laminations of the unit laminate structures 16 each including the quantum well emission layer and the injection layer is arbitrarily set. The active layer 15 is formed on the semiconductor substrate 10 directly or via another semiconductor layer. In addition, the quantum well structure in the active layer 15 and the subband level structure thereby will be described in detail later.

FIG. 3 shows a specific example of the semiconductor lamination structure other than the semiconductor substrate 10 and the active layer 15 in the quantum cascade laser 1A. In the configuration example shown in FIG. 3, an n-type InP single crystal substrate is used as the semiconductor substrate 10. Then, on this InP substrate 10, in the order from the substrate side, an InP lower cladding layer 50, an InGaAs lower core layer 51, the active layer 15 formed by multistage-laminating the unit laminate structures 16, an InGaAs upper core layer 52, an InP upper cladding layer 53, and an InGaAs contact layer 54 are laminated sequentially, and accordingly, the semiconductor lamination structure in the device main body of the quantum cascade laser 1A is formed.

The quantum cascade laser 1A according to the present embodiment is, as shown in FIG. 1, formed to be a ridge structure having a base portion 20 including the semiconductor substrate 10, and a ridge portion 25 including the active layer 15, which is provided on the base portion 20. The ridge portion 25 is formed into a stripe shape extending in the resonating direction of light (the y-axis direction) in a laser cavity structure for light with a predetermined wavelength generated in the active layer 15. Further, the ridge portion 25 is formed to have a width w0 (refer to FIG. 2) narrower than a device width w in the x-axis direction of the base portion 20.

In the configuration example shown in FIG. 3, this ridge portion 25 is configured to include the lower cladding layer 50, the lower core layer 51, the active layer 15, the upper core layer 52, the upper cladding layer 53, and the contact layer 54. Such a ridge-shaped laser device structure can be formed by a normal etching process. In this case, the base portion 20 is configured such that the upper surface of the semiconductor substrate 10 is exposed as the upper surface of the base portion 20.

Further, in the laser 1A according to the present embodiment, a reflection control film 30 is formed at least on a first end face 11 which is one surface of the first end face 11 and a second end face 12 facing each other in the resonating direction. This reflection control film 30 is, as shown in FIG. 1 to FIG. 3, formed continuously from a ridge end face 115 of the ridge portion 25 including one end portion in the resonating direction of the active layer 15, over a base end face 110 of the base portion 20.

Further, as a range of forming the reflection control film 30, the reflection control film 30 is formed on the entire surface on the ridge end face 115. On the other hand, on the base end face 110, with respect to a first side 111 on the ridge portion 25 side of the base end face 110, a second side 112 and a third side 113 adjacent to the first side 111, and a fourth side 114 facing the first side 111, as shown in FIG. 2, the reflection control film 30 is formed on a region other than a region with a predetermined width w2 from the second side 112, a region with a predetermined width w3 from the third side 113, and a region with a predetermined width w4 from the fourth side 114.

Further in the present embodiment, the reflection control film 30 includes, in addition to a base side film portion 31 on the base end face 110, and a ridge side film portion 32 on the ridge end face 115, an additional film portion 33 which is additionally formed so as to go around from the base end face 110 onto an upper surface of the base portion 20 (surface on the ridge portion 25 side) with a predetermined width w5, and an additional film portion 34 which is additionally formed, in the same way, so as to go around from the ridge end face 115 onto an upper surface and both side surfaces of the ridge portion 25.

The effects of the quantum cascade laser 1A of the present embodiment will be described.

In the quantum cascade laser 1A according to the present embodiment, the laser device is configured with a ridge structure having the base portion 20 including the semiconductor substrate 10, and the ridge portion 25 including the active layer 15 of the cascade structure, which is formed into a stripe shape extending in the resonating direction. Further, the reflection control film 30 is formed so as to continue from the ridge end face 115 including the end portion of the active layer 15 over the base end face 110 at least on the first end face 11 which is one of the two device end faces 11 and 12 located in the resonating direction in the laser cavity structure for light with a predetermined wavelength generated in the active layer 15.

Moreover, in the above-described configuration, in the base side film portion 31 formed on the base end face 110 in the reflection control film 30, for the second side (lateral side) 112 and the third side (lateral side) 113 which are the two sides adjacent to the first side (upper side) 111 on the ridge portion side of the base end face 110, and the fourth side (lower side) 114 which is the one side opposite to the first side 111, the reflection control film 30 is not formed on a region with the predetermined width w2 from the second side 112, a region with the predetermined width w3 from the third side 113, and a region with the predetermined width w4 from the fourth side 114 (here, w2>0, w3>0, w4>0), and the reflection control film 30 is formed on a region excluding those regions near the three sides.

In this way, in accordance with the configuration in which the reflection control film 30 is not formed on regions near the three sides of the two lateral sides 112 and 113, and the one lower side 114 of the base end face 110, it is possible to suppress transmutation and deterioration in the reflection control film 30 due to burrs, peeling, cracks, and the like being caused in the manufacturing process of the laser device of the quantum cascade laser 1A. Accordingly, it is possible to realize the quantum cascade laser 1A in which a laser oscillation mode is preferably controlled by the reflection control film 30 without lowering production yield, reliability, device lifetime, and the like due to deterioration in the reflection control film 30.

In addition, in the configuration of the reflection control film 30 described above, the widths w2, w3, and w4 of the regions on which the reflection control film 30 is not formed on the base end face 110 may be the same width or widths different from each other for the respective sides 112, 113, and 114. Further, the widths w2, w3, and w4 of the regions are not necessarily constant widths for the respective entire sides, and may be configured such that the widths of the regions on which the reflection control film 30 is not formed change along the sides. In general, as described above, the configuration that the reflection control film 30 is not formed on regions near the three sides of the two lateral sides and the one lower side of the base end face 110 may be adopted.

In the quantum cascade laser 1A having the above-described configuration, the specific configuration conditions such as a size may be appropriately set according to the characteristics and the like required for the respective laser devices. As an example of such a configuration, a cavity length of a laser device is l=2 to 4 mm, a chip width of the device is w=500 µm, and a stripe width of the ridge portion 25 is w0=5 to 20 µm, and with respect to a device height, a height of the base portion 20 is h1=150 µm, and a height of the ridge portion 25 is h2=10 µm.

Further, with respect to the reflection control film 30 formed on the device end face 11 of the laser 1A, a width of forming the reflection control film 30 on the base end face 110 is w1=100 to 400 µm, a width of the region on which the reflection control film 30 is not formed near the lower side 114 of the base end face 110 is w4=5 to 50 µm, and widths of forming the additional film portions 33 and 34 (a going-around amount) going around onto the upper surface of the base portion 20, and onto the upper surface and the both side surfaces of the ridge portion 25 are w5=10 to 100 µm.

Suppression of transmutation and deterioration of the reflection control film 30 in the quantum cascade laser 1A having the above-described configuration will be further described. FIG. 4 includes diagrams showing a configuration of a laser bar in which a plurality of laser devices which are the quantum cascade lasers 1A, respectively, having the above-described configuration are arrayed in a predetermined direction, and (a) in FIG. 4 shows a perspective view, and (b) in FIG. 4 shows a bottom view from the lower surface side of the semiconductor substrate.

As described above, in the manufacturing process of the quantum cascade laser 1A, coating of the reflection control film 30 onto the end face 11 is usually carried out in a state of a laser bar 2A in which a plurality of quantum cascade laser devices are arrayed in a direction (the x-axis direction) perpendicular to the resonating direction of light (the y-axis direction) to be integrated. The laser bar 2A onto which the reflection control films 30 are formed is, as dividing lines 21 are shown by the dashed lines in FIG. 4, divided into the individual laser devices 1A by a dividing method such as cleavage, and thereafter, a process of mounting each laser device 1A onto a sub-mount is performed.

At this time, in the configuration such as a laser device in a long wavelength region in which a film thickness of the reflection control film 30 is thick, and the film is formed on the entire surface of the end face 11 including the dividing lines 21, at the time of cleavage to a single device along the dividing lines 21, the reflection control film 30 is not segmented along with the device main body, that may cause burrs, peeling, and the like in some cases. Further, at the time of mounting the laser device 1A onto the sub-mount with the lower surface of the semiconductor substrate 10 serving as a mounting surface, for example, a chip is fixed to the sub-mount by an electrically-conductive adhesive, a solder, or the like, however, in some cases, cracks, peeling, and the like may be caused in the reflection control film 30 due to thermal stress and the like in this mounting process.

Meanwhile, in the quantum cascade laser 1A according to the above-described embodiment, as described above, the configuration in which the reflection control film 30 is not formed on regions near the two lateral sides 112 and 113 and the one lower side 114 of the base end face 110 is adopted. In accordance with this configuration, the reflection control film 30 is not formed on regions near the two lateral sides 112 and 113 corresponding to the dividing lines 21 in the laser bar 2A, thereby suppressing burrs, peeling, and the like from being caused at the time of dividing the laser devices by cleavage. Further, the reflection control film 30 is not formed on a region near the lower side 114, thereby suppressing cracks and the like from being caused at the time of mounting the laser 1A onto the sub-mount with the device lower surface serving as a mounting surface. With this, it is possible to suppress transmutation and deterioration in the reflection control film 30 in the manufacturing process of the laser device.

Here, in the quantum cascade laser 1A described above, it is preferable that the reflection control film 30 is, as its cross-sectional shape is shown in FIG. 3 and (b) in FIG. 4, formed into a cross-sectional shape which is reduced in film thickness at a peripheral portion of the reflection control film 30. With this, it is possible to more adequately suppress transmutation and deterioration in the reflection control film due to burrs, peeling, cracks, and the like being caused in the manufacturing process of the laser device 1A. In the laser 1A according to the above-described embodiment, the reflection control film 30 is formed to have a constant film thickness in the predetermined region including the end portion of the active layer 15, thereby realizing the desired reflective characteristics. On the other hand, the laser is configured such that, in the vicinity of the peripheral portion, the film thickness of the reflection control film 30 is gradually reduced, to reach the film thickness of 0, thereby suppressing peeling and the like of the reflection control film 30 from being caused.

Further, as shown in FIG. 1, the reflection control film 30 preferably has the additional film portions 33 and 34 which are additionally formed so as to respectively go around from the base end face 110 onto the upper surface which is a surface on the ridge portion 25 side of the base portion 20, and from the ridge end face 115 onto the upper surface and the both side surfaces of the ridge portion 25. With this configuration in which the additional film portions 33 and 34 are provided as well, it is possible to more adequately suppress transmutation and deterioration in the reflection control film due to burrs, peeling, cracks, and the like being caused in the manufacturing process of the laser device 1A.

Further, specifically, the reflection control film 30 may use a configuration including at least one layer of $CeO_2$ film. $CeO_2$ (cerium oxide) is a material showing high permeability to light within long wavelength and mid-infrared regions, and showing good insulating performance when being formed on a laser device end face. Accordingly, the reflection control film 30 including a $CeO_2$ film is applied to a quantum cascade laser 1A, thereby it is possible to preferably realize reflectance control on the device end face.

Further, the reflection control film 30 may be configured as a multilayer film in which low refraction index films and high refraction index films are alternately laminated. According to such a reflection control multilayer film, it is possible to preferably set and control a reflectance for light with a predetermined wavelength on the device end face by the specific design of the multilayer structure using the low refraction index film and the high refraction index film. Further, in the case where the reflection control film 30 includes the above-described $CeO_2$ film, the $CeO_2$ film is usually used as a low refraction index film.

Further, the reflection control film 30 is preferably an anti-reflection film for light with a predetermined wavelength, or a reflection film that reflects light with a predetermined wavelength at a predetermined reflectance. By forming such an anti-reflection (AR) film or a reflection film (for example, a high-reflection (FIR) film) on the end face, it is possible to preferably constitute a quantum cascade laser 1A according to the specific cavity structure thereof. In addition, in FIG. 1, the configuration in which the reflection control film 30 is formed on the first end face 11 in the first and second end faces 11 and 12 of the laser device 1A is shown as an example, however, a configuration that reflection control films are respectively formed on the both surfaces of the first and second end faces 11 and 12 may be adopted.

The configuration of the active layer 15 in the quantum cascade laser 1A will be described along with a specific configuration example. FIG. 5 is a diagram showing an example of a configuration of an active layer of the quantum cascade laser shown in FIG. 1, and a subband level structure in the active layer. In addition, the configuration example shown in FIG. 5 may be referred to Patent Document 1 (Japanese Patent Application Laid-Open No. 2011-243781).

As shown in FIG. 5, each of the plurality of unit laminate structures 16 included in the active layer 15 consists of a quantum well emission layer 17 and an electron injection layer 18. Each of these emission layer 17 and injection layer 18 is formed to have a predetermined quantum well structure including quantum well layers and quantum barrier layers. Accordingly, in the unit laminate structure 16, a subband level structure that is an energy level structure according to a quantum well structure is formed.

The unit laminate structure 16 constituting the active layer 15 in the quantum cascade laser 1A according to the present embodiment has, as shown in FIG. 5, in the subband level structure, a first emission upper level $L_{up1}$, a second emission upper level $L_{up2}$ having energy higher than the first emission upper level, and a plurality of emission lower levels $L_{low}$ respectively having energies lower than the first emission upper level, as levels relating to light emission by means of intersubband transition.

Further, in the present embodiment, the emission layer 17 is configured to include n (n is an integer of 2 or more) well layers, and one of the first and second emission upper levels $L_{up1}$ and $L_{up2}$ is a level arising from a ground level in the first well layer closest to the injection layer 18a side of the preceding stage, and the other is a level arising from an excitation level in the well layers other than the first well layer (the second to the n-th well layers). Further, an energy interval between the first emission upper level $L_{up1}$ and the second emission upper level $L_{up2}$ is set to be smaller than an energy $E_{LO}$ of a longitudinal optical (LO: Longitudinal Optical) phonon.

Here, the energy $E_{LO}$ of the LO phonon is, for example, in the case where InGaAs is assumed as a semiconductor material of the quantum well layer, $E_{LO}$=34 meV. Further, the energy $E_{LO}$ of the LO phonon is 36 meV in the case where the quantum well layer is GaAs, and is 32 meV in the case where the quantum well layer is InAs, which are of substantially the same level as 34 meV described above.

In this level structure, the two emission upper levels $L_{up1}$ and $L_{up2}$ are preferably designed such that, under the conditions of the operating electric field, the energy positions of the respective levels are matched to one another, and the wave functions are strongly coupled (anticrossing). In this case, these two upper levels behave like one emission upper level having a range in energy. In such a structure, it is possible to control the emission half width (FWHM) by changing the coupling strength of the two upper levels. Further, the plurality of emission lower levels $L_{low}$ constitute a lower miniband MB including a plurality of levels, and the emission transition from the first and second emission upper levels is dispersed to the lower miniband.

Further, in the unit laminate structure 16 shown in FIG. 5, an injection barrier layer 171 for electrons injected from the injection layer 18a to the emission layer 17 is provided between the emission layer 17 and the injection layer 18a of the preceding stage. Further, an exit barrier layer 191 for electrons from the emission layer 17 to the injection layer 18 is provided, as necessary, between the emission layer 17 and the injection layer 18 as well. However, FIG. 5 shows, as an example, a configuration in which only a barrier layer thin enough for satisfactorily leaking out the wave functions is provided between the emission layer 17 and the injection layer 18.

Further, in the present level structure, the miniband MB has a band structure in which a miniband in the quantum well emission layer 17 and a miniband in the injection layer 18 are coupled, and a plurality of levels are distributed broadly from the emission layer 17 to the injection layer 18. With this configuration, the portion in the emission layer 17 on the higher energy side of the miniband MB functions as a lower miniband composed of the plurality of emission lower levels $L_{low}$ described above, and the portion in the injection layer 18 on the lower energy side functions as a relaxation miniband including relaxation levels $L_r$ that relax electrons after emission transition from the emission lower levels $L_{low}$ to an emission layer 17b of the subsequent stage.

In this way, the continuum levels are used as the emission lower levels $L_{low}$ and the relaxation levels $L_r$, thereby it is possible to extremely highly efficiently form a population inversion. Further, among the plurality of relaxation levels $L_r$ constituting the relaxation miniband, a ground level $L_g$ in the injection layer 18 is preferably designed to be strongly coupled to the second emission upper level $L_{up2}$ in the emission layer 17b in a unit laminate structure of the subsequent stage under the conditions of the operating electric field.

In this subband level structure, electrons e⁻ from the relaxation level $L_r$ in the injection layer 18a of the preceding stage are injected into the emission layer 17 due to a resonant tunneling effect via the injection barrier, thereby strongly exciting the second emission upper level $L_{up2}$ coupled to the relaxation level $L_r$. Further, at this time, sufficient electrons are supplied to the first emission upper level $L_{up1}$ as well via a high-speed scattering process such as electron-electron scattering, and the like, thereby supplying sufficient carriers to both the two emission upper levels $L_{up1}$ and $L_{up2}$.

The electrons injected into the first emission upper level $L_{up1}$ and the second emission upper level $L_{up2}$ respectively transit to the plurality of emission lower levels $L_{low}$ constituting the lower miniband, and at this time, light hv with a wavelength corresponding to an energy difference between subband levels of the upper levels $L_{up1}$, $L_{up2}$ and the lower levels $L_{low}$, is generated and emitted. Further, at this time, as described above, because the two upper levels behave like one emission upper level having a range in energy, an emission spectrum to be obtained becomes a spectrum having a homogeneous spread. In addition, in FIG. 5, for illustrative convenience, only the emission transitions from the upper levels $L_{up1}$, $L_{up2}$ to the lower level $L_{low}$ on the highest energy side are shown, and the transitions to the other lower levels are not illustrated.

The electrons transited to the emission lower levels $L_{low}$ are relaxed at high speed by means of relaxation in the miniband via LO phonon scattering, electron-electron scattering, and the like, in the miniband MB. In this way, in extraction of carriers from the emission lower levels $L_{low}$ utilizing relaxation in the miniband, a population inversion is easily formed between the two upper levels $L_{up1}$, $L_{up2}$ and the plurality of lower levels $L_{low}$. Further, the electrons relaxed from the emission lower levels $L_{low}$ to the levels L, in the injection layer 18 are injected in a cascade manner to the emission upper levels $L_{up1}$ and $L_{up2}$ in the emission layer 17b of the subsequent stage via the ground level $L_g$ in the injection layer 18 that is a relaxation level on the lower energy side.

These injection, emission transition and relaxation of electrons are repeated in the plurality of unit laminate structures 16 constituting the active layer 15, whereby light generation occurs in a cascade manner in the active layer 15. That is, by alternately laminating many quantum well emission layers 17 and injection layers 18, the electrons successively move through the laminate structures 16 in a cascade manner, and light hν is generated at the time of the intersubband transition in each laminate structure 16. Moreover, such light is resonated in the optical cavity of the laser 1A, whereby a laser beam with a predetermined wavelength is generated. In this way, the configuration in which it is possible to realize a broad emission spectrum is extremely useful for a single mode continuous wavelength variable light source, for example, with an external cavity type configuration or a distributed feedback type configuration.

FIG. 6 is a chart showing an example of a structure of a unit laminate structure of one period in the active layer. The configuration shown in FIG. 6 is a specific example of the active layer having the subband level structure shown in FIG. 5. Further, as a quantum well structure of the active layer 15 in the present configuration example, an example that the structure is designed to have an oscillation wavelength of 10 μm is shown. In addition, such a semiconductor laminate structure of the quantum cascade laser 1A may be formed by crystal growth, for example, by the molecular beam epitaxy (MBE) method or the metal organic vapor phase epitaxy (MOVPE) method.

The active layer 15 in this configuration example is configured by laminating the unit laminate structures 16 at predetermined periods each including the quantum well emission layer 17 and the electron injection layer 18. Further, the unit laminate structure 16 of one period is configured as a quantum well structure by alternately laminating eleven quantum well layers 161 to 164 and 181 to 187, and eleven quantum barrier layers 171 to 174 and 191 to 197. Among these respective semiconductor layers, the quantum well layers are formed of InGaAs layers. Further, the quantum barrier layers are formed of InAlAs layers. Accordingly, the active layer 15 is configured by an InGaAs/InAlAs multiple quantum well structure.

Further, with respect to the emission layer 17 and the injection layer 18 in this unit laminate structure 16, in the lamination structure shown in FIG. 6, the lamination portion consisting of the four well layers 161 to 164 and the barrier layers 171 to 174 mainly functions as the emission layer 17. Further, the lamination portion consisting of the seven well layers 181 to 187 and the barrier layers 191 to 197 mainly functions as the injection layer 18. Further, among the respective semiconductor layers of the emission layer 17, the quantum barrier layer 171 of the first stage is positioned between the injection layer of the preceding stage and the emission layer 17, to serve as an injection barrier layer for electrons from the injection layer of the preceding stage to the emission layer 17.

In addition, in the present configuration example, with respect to the exit barrier layer positioned between the emission layer 17 and the injection layer 18 for electrons from the emission layer 17 to the injection layer 18, there is no barrier layer effectively functioning as an exit barrier. In FIG. 6, the barrier layer 191 is formally specified as an exit barrier layer, and the emission layer 17 and the injection layer 18 are functionally divided before and after this barrier layer. Further, the respective layer thicknesses of the well layers and the barrier layers constituting the emission layer 17 and the injection layer 18 in the active layer 15 are designed based on quantum mechanics.

Next, a specific example of the reflection control film 30 formed on the device end face 11 of the quantum cascade laser 1A will be described. In the configuration example of the reflection control film which is hereinafter shown, the reflection control film 30 is composed of a multilayer film with light in a wavelength band of 10 μm as an object, and $CeO_2$ or ZnS is used as a low refraction index material, and Ge is used as a high refraction index material for the multilayer film. Because $CeO_2$ is transparent and has a low refraction index in a wavelength band of 10 μm, has excellent insulating characteristics, and is stable in the air, $CeO_2$ is an appropriate material for the first layer in contact with the device main body and the outermost layer in the reflection control multilayer film. Further, in the following description, with respect to the refractive indices n of the respective materials, the device main body of the quantum cascade laser (QCL) 1A is n=3.19, and further, $CeO_2$ is n=1.6, ZnS is n=2.2, and Ge is n=4.0.

Figure 7:
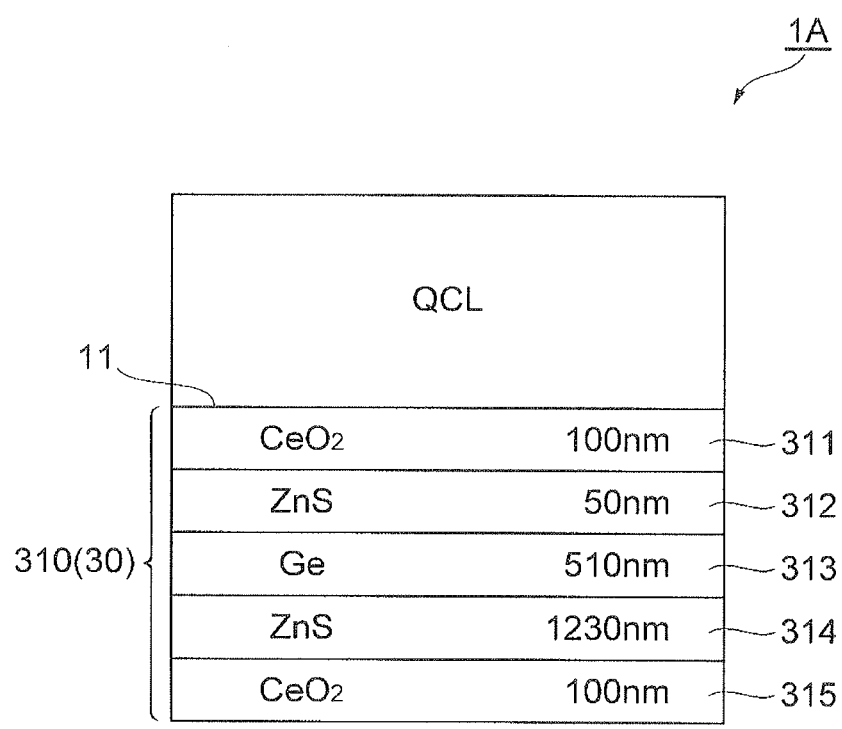
FIG. 7 is a side view showing a first configuration example of a reflection control film.

FIG. 7 is a side view showing a first configuration example of the reflection control film 30 formed on the quantum cascade laser 1A. A reflection control film 310 of the present configuration example is designed as an anti-reflection (AR) film for light with a wavelength λ=10.0 μm, and a $CeO_2$ film 311 with a thickness of 100 nm, a ZnS film 312 with a thickness of 50 nm, a Ge film 313 with a thickness of 510 nm, a ZnS film 314 with a thickness of 1230 nm, and a $CeO_2$ film 315 with a thickness of 100 nm are laminated on the end face 11 of the laser device 1A, thereby constituting the anti-reflection film 310 by a multilayer film. The total thickness of this anti-reflection film 310 is 1990 nm, and the light reflectance is 0.001%.

Figure 8:
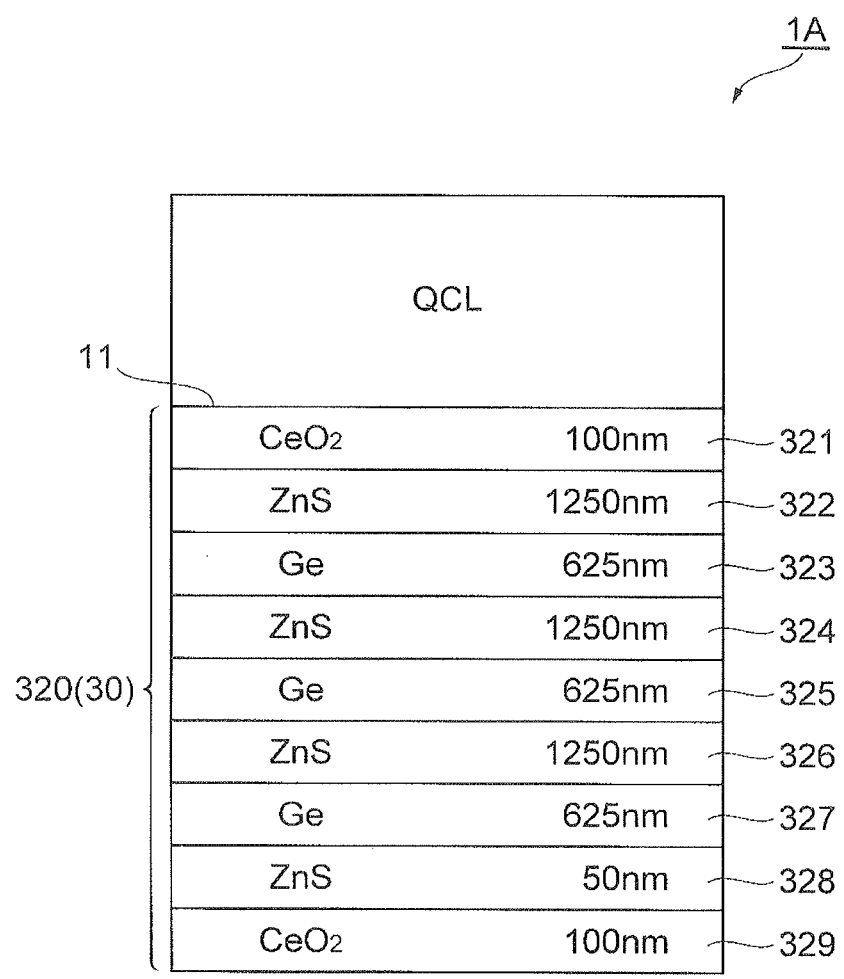
FIG. 8 is a side view showing a second configuration example of the reflection control film.

FIG. 8 is a side view showing a second configuration example of the reflection control film 30 formed on the quantum cascade laser 1A. A reflection control film 320 of the present configuration example is designed as a high-reflection (FIR) film for light with a wavelength λ=10.0 μm, and a $CeO_2$ film 321 with a thickness of 100 nm, a ZnS film 322 with a thickness of 1250 nm, a Ge film 323 with a thickness of 625 nm, a ZnS film 324 with a thickness of 1250 nm, a Ge film 325 with a thickness of 625 nm, a ZnS film 326 with a thickness of 1250 nm, a Ge film 327 with a thickness of 625 nm, a ZnS film 328 with a thickness of 50 nm, and a $CeO_2$ film 329 with a thickness of 100 nm are laminated on the end face 11 of the laser device 1A, thereby constituting the high-reflection film 320 by a multilayer film. The total thickness of this high-reflection film 320 is 5875 nm, and the light reflectance is 95.979%.

As shown in these configuration examples, in a long wavelength region such as a wavelength range of 10 μm, a designed film thickness of the reflection control film by a multilayer film of low refraction index films and high refraction index films or the like is extremely thickened, which leads to problems of transmutation and deterioration in the reflection control film in the manufacturing process of the laser device. Meanwhile, in accordance with the quantum cascade laser 1A having the above-described configuration, the configuration in which a reflection control film is not formed on regions near the two lateral sides and the one lower side other than the upper side on the ridge portion side of the base end face is adopted, thereby it is possible to prevent transmutation and deterioration in the manufacturing process thereof even in the case where the film thickness of the reflection control film is thickened.

Next, a manufacturing method of the quantum cascade laser 1A having the reflection control film 30 having the above-described configuration will be described. FIG. 9 includes perspective views showing an example of configurations of a laser bar fixing jig and a mask which are used in a process of forming the reflection control film 30, (a) in FIG. 9 shows a configuration of a laser bar fixing jig 60, and (b) in FIG. 9 shows a configuration of a plate-shaped mask 65 for forming a reflection control film. Further, FIG. 10 includes diagrams showing an example of the process of forming the reflection control film 30 using the laser bar fixing jig 60 and the mask 65 shown in FIG. 9, and (a) in FIG. 10 shows a perspective view, and (b) in FIG. 10 shows a plan sectional view.

Formation of the reflection control film 30 onto the end face of the quantum cascade laser 1A is carried out by use of a vacuum deposition apparatus such as an electron beam evaporation apparatus in a state of the laser bar 2A (refer to FIG. 4) as described above. In the laser bar fixing jig 60 shown in FIG. 9, a predetermined number of (for example, about 10) laser bars 2A are arrayed adjacent to one another in a frame body 61. At this time, the laser bars 2A are arrayed such that the device end face on which the reflection control film 30 is formed is exposed upward in the drawing in a state in which dummy bars are sandwiched between the adjacent laser bars 2A, and are fixed to the frame body 61 with fixation bars 62 on the both ends and fixation springs 63.

For the exposed end faces of the plurality of laser bars 2A thus fixed to the fixing jig 60, its upper side is covered with the plate-shaped mask 65, and as shown in (a) in FIG. 10, the mask 65 is fixed to the frame body 61 of the fixing jig 60. This plate-shaped mask 65 is a slit plate having a plurality of slits (opening portions) 66 formed with a period matched to a layout interval (formation interval of the reflection control film 30) of the laser device 1A in the laser bar 2A. Such a slit plate may be, for example, formed by normal lithography technique and etching technique by use of a semiconductor substrate such as an Si substrate.

In such a configuration in which the fixing jig 60 and the plate-shaped mask 65 are used, as shown in (b) in FIG. 10, a layout interval d1 and an opening width d2 of slits are appropriately set so as to correspond to a device width of the quantum cascade laser 1A and a formation width of the reflection control film 30, thereby forming the reflection control film 30 in a predetermined region including the end portion of the active layer 15 and the like, and the regions near the dividing lines 21 in the laser bar 2A corresponding to the two lateral sides of the base end face of the laser 1A are masked, so as not to form the reflection control film 30. Further, in the reflection control film 30 formed in such a method, its cross-sectional shape becomes a shape which is gradually reduced in film thickness at the peripheral portion of the film. In addition, as an example of such a configuration, a layout interval of the slits may be set to $d1=500$ μm, and an opening width may be set to $d2=100$ to 200 μm.

Further, with respect to a region near the lower side of the base end face in the laser 1A in the laser bar 2A, at the time of fixing the laser bars 2A along with the dummy bars to the fixing jig 60, those are fixed so as to sandwich the laser bars 2A with the dummy bars different in height, thereby it is possible to realize a configuration in which the reflection control film 30 is not formed on the region near the lower side. That is, the dummy bar taller than the laser bar 2A is disposed on the base portion 20 side of the laser 1A in the laser bar 2A, and the dummy bar shorter than the laser bar 2A is disposed on the ridge portion 25 side.

At this time, the taller dummy bar disposed on the base portion 20 side serves as a shadow mask, so as to prevent the reflection control film 30 from going around onto the device lower surface, and the reflection control film 30 is not formed on a region near the device lower side due to this shadow mask. Further, by disposing the shorter dummy bar on the ridge portion 25 side, the additional film portions 33 and 34 are formed due to the reflection control film 30 going around onto the device upper surface and the like. Thereby, it is possible to suppress peeling and the like of the reflection control film 30 from the device upper surface by an anchor effect of the additional film portions 33 and 34.

In addition, the fixing jig and the mask used for forming a reflection control film are not limited to the configuration shown in FIG. 9 and FIG. 10, and various configurations may be used specifically. FIG. 11 includes diagrams showing another example of the process of forming the reflection control film 30 using the laser bar fixing jig and the mask, and (a) in FIG. 11 shows a perspective view, and (b) in FIG. 11 shows a plan sectional view. In the configuration shown in FIG. 11, a rod-shaped mask 68 in which a plurality of rod-shaped members are disposed at predetermined intervals is used as a mask covering the end faces of the plurality of laser bars 2A fixed to the fixing jig 60.

In accordance with the configuration in which the fixing jig 60 and the rod-shaped mask 68 are used as well, as shown in (b) in FIG. 11, a layout interval d3 and a width d4 of rod-shaped members are appropriately set, thereby forming the reflection control film 30 on a predetermined region including the end portion of the active layer 15 and the like, and the regions near the dividing lines 21 in the laser bar 2A corresponding to the two lateral sides of the base end face in the laser 1A are masked, so as not to form the reflection control film 30. In addition, as an example of such a configuration, a layout interval of the rod-shaped members may be set to $d3=500$ μm, and a width may be set to $d4=300$ μm. Further, with respect to the specific configuration of the mask, the rod-shaped mask 68 is configured by the plurality of rod-shaped members in the present configuration example, however, it is not limited to such a configuration, and, for example, the mask may be configured by a plurality of plate-shaped members.

The quantum cascade laser according to the present invention is not limited to the above-described embodiment and configuration examples, and various modifications thereof are possible. For example, in the configuration examples described above, the example has been shown that the InP substrate is used as the semiconductor substrate, and the active layer is made of InGaAs/InAlAs, however, specifically, various configurations may be used as long as emission transition due to intersubband transition in the quantum well structure is possible.

As the semiconductor material system, in addition to InGaAs/InAlAs described above, various material systems such as GaAs/AlGaAs, InAs/AlGaSb, AlGaN/GaN, and Si/SiGe, etc., may be used. Also, various methods such as an MBE method or an MOCVD method can be used as a semiconductor crystal growth method. Further, as the lamination structure in the active layer of the quantum cascade laser and the semiconductor lamination structure as a whole of the laser device, various structures other than the above-described structures may be used.

Further, FIG. 5 shows one example of the quantum well structure and the subband level structure in the active layer of the quantum cascade laser, and specifically, those are not limited to the above-described configurations, and various configurations may be used. Generally, any configuration of the active layer 15 may be adopted as long as the active layer has a cascade structure and is configured to be capable of generating light by intersubband transition in the quantum well structure. Further, the numbers of quantum well layers and barrier layers constituting the emission layer 17 and the injection layer 18, and the respective layer thicknesses of these as well may be arbitrarily set according to a specific level structure, etc., necessary for the light emitting operations.

Further, the reflection control film 30 formed on the end face of the quantum cascade laser as well is specifically not limited to the configuration shown in FIG. 1 to FIG. 3, and various configurations may be used. For example, in the above-described configuration example, a configuration that the additional film portions 33 and 34 formed so as to respectively go around onto the upper surface of the base portion 20, and onto the upper surface and the both side surfaces of the ridge portion 25 are not provided may be adopted, if not necessary. Further, a method for forming the reflection control film 30 as well is not limited to the method shown in FIG. 9 to FIG. 11, and specifically, various methods may be used.

The quantum cascade laser according to the embodiment described above includes (1) a semiconductor substrate, and (2) an active layer which is provided on the semiconductor substrate, and has a cascade structure in which quantum well emission layers and injection layers are alternately laminated by multistage-laminating unit laminate structures each consisting of the quantum well emission layer and the injection layer, the active layer generates light by intersubband transition in a quantum well structure, and the quantum cascade laser includes (3) a base portion including the semiconductor substrate, and a ridge portion including the active layer, being provided on the base portion, and extending to be a stripe shape in a resonating direction in a laser cavity structure for light with a predetermined wavelength generated in the active layer, and in the quantum cascade laser, (4) a reflection control film is formed from a ridge end face of the ridge portion including an end portion of the active layer over a base end face of the base portion on at least a first end face of the first end face and a second end face facing each other in the resonating direction, and (5) on the base end face, with respect to a first side on the ridge portion side of the base end face, a second side and a third side which are adjacent to the first side, and a fourth side facing the first side, the reflection control film is formed on a region excluding a region with a predetermined width from the second side, a region with a predetermined width from the third side, and a region with a predetermined width from the fourth side.

Here, in the quantum cascade laser described above, the reflection control film is preferably formed into a cross-sectional shape which is reduced in film thickness at a peripheral portion thereof. Thereby, it is possible to more adequately suppress transmutation and deterioration in the reflection control film due to burrs, peeling, cracks, and the like being caused in the manufacturing process of the laser device.

Further, the reflection control film preferably has additional film portions which are additionally formed so as to respectively go around from the base end face onto the upper surface which is a surface on the ridge portion side of the base portion, and from the ridge end face onto the upper surface and the both side surfaces of the ridge portion. In accordance with this configuration as well, it is possible to more adequately suppress transmutation and deterioration in the reflection control film due to burrs, peeling, cracks, and the like being caused in the manufacturing process of the laser device.

Further, specifically, the reflection control film may use a configuration including at least one layer of $CeO_2$ film. $CeO_2$ (cerium oxide) is a material which shows high permeability for light in long wavelength and mid-infrared regions, and shows good insulating performance when being formed on the device end face. Accordingly, the reflection control film including the $CeO_2$ film is applied to the quantum cascade laser, thereby it is possible to preferably achieve control of reflectance on the device end face.

Further, the reflection control film may be configured as a multilayer film in which low refraction index films and high refraction index films are alternately laminated. In accordance with this reflection control multilayer film, with the specific design of the multilayer structure using the low refraction index films and high refraction index films, it is possible to preferably set and control the reflectance for light with a predetermined wavelength on the device end face. Further, in the case where the reflection control film includes the $CeO_2$ film, the $CeO_2$ film is usually used as a low refraction index film.

Further, the reflection control film is preferably an anti-reflection film for light with the predetermined wavelength, or a reflection film that reflects light with the predetermined wavelength at a predetermined reflectance. By forming such an anti-reflection (AR) film or a reflection film (for example, a high-reflection (BR) film) on the end face, it is possible to preferably constitute a quantum cascade laser according to the specific cavity structure thereof.

The present invention is available as a quantum cascade laser capable of suppressing transmutation and deterioration in a reflection control film in the manufacturing process of a laser device.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A quantum cascade laser comprising:
a semiconductor substrate; and
an active layer being provided on the semiconductor substrate, and having a cascade structure in which quantum well emission layers and injection layers are alternately laminated by multistage-laminating unit laminate structures each consisting of the quantum well emission layer and the injection layer, the active layer generating light by intersubband transition in a quantum well structure, wherein the quantum cascade laser includes
a base portion including the semiconductor substrate, and a ridge portion including the active layer, being provided on the base portion, and extending to be a stripe shape in a resonating direction in a laser cavity structure for light with a predetermined wavelength generated in the active layer, and wherein
a reflection control film is formed from a ridge end face of the ridge portion including an end portion of the active layer over a base end face of the base portion, at least on a first end face between the first end face and a second end face facing each other in the resonating direction, and the reflection control film is a multilayer film in which a low refraction index film and a high refraction index film are alternately laminated,
on the base end face, for a first side on the ridge portion side of the base end face, a second side and a third side adjacent to the first side, and a fourth side facing the first side, the reflection control film is formed on a region other than a region with a predetermined width from the second side, a region with a predetermined width from the third side, and a region with a predetermined width from the fourth side, and
the reflection control film has additional film portions which are additionally formed so as to respectively go around from the base end face onto an upper surface of the base portion, and from the ridge end face onto an upper surface and both side surfaces of the ridge portion.

2. The quantum cascade laser according to claim 1, wherein the reflection control film is formed into a cross-sectional shape which is reduced in film thickness at a peripheral portion thereof.

3. The quantum cascade laser according to claim 1, wherein the reflection control film includes at least one layer of $CeO_2$ film.

4. The quantum cascade laser according to claim 1, wherein the reflection control film is an anti-reflection film for light with the predetermined wavelength, or a reflection film that reflects light with the predetermined wavelength at a predetermined reflectance.

5. The quantum cascade laser according to claim 1, wherein a total film thickness of the multilayer film, which is the reflection control film, is 1 µm or more.

* * * * *